United States Patent
Rüttiger et al.

(10) Patent No.: US 7,345,273 B2
(45) Date of Patent: Mar. 18, 2008

(54) INTEGRATED OPTICAL ENCODER

(75) Inventors: Anton Rüttiger, Wildflecken (DE); Markus Peschel, Münnerstadt (DE); Thomas Ofenhitzer, Salz (DE)

(73) Assignee: Preh GmbH, Bad Neustadt/Saale (DE)

( * ) Notice: Subject to any disclaimer, the term of this patent is extended or adjusted under 35 U.S.C. 154(b) by 0 days.

(21) Appl. No.: 11/373,279

(22) Filed: Mar. 13, 2006

(65) Prior Publication Data

US 2006/0202114 A1   Sep. 14, 2006

Related U.S. Application Data

(63) Continuation of application No. PCT/EP2004/009983, filed on Sep. 8, 2004.

(30) Foreign Application Priority Data

Sep. 11, 2003   (DE) ............................... 103 42 326

(51) Int. Cl.
- G01D 5/34 (2006.01)
- G01D 5/36 (2006.01)
- G01B 5/24 (2006.01)
- H03M 1/22 (2006.01)

(52) U.S. Cl. ........................... 250/231.13; 250/231.18; 250/237 G; 250/237 R; 33/1 PT; 33/1 N; 341/11

(58) Field of Classification Search ................ 250/229, 250/231.13–231.18, 214 SW, 221, 222.1, 250/237 R, 237 G; 341/11, 13, 31; 33/1 PT, 33/1 N; 200/61.02; 318/600, 601

See application file for complete search history.

(56) References Cited

U.S. PATENT DOCUMENTS

| 4,940,926 A | 7/1990 | Periou |
| 7,109,469 B2* | 9/2006 | Hayashi ...................... 250/221 |
| 2003/0182810 A1* | 10/2003 | Sano ........................ 331/1 PT |
| 2005/0133696 A1* | 6/2005 | Orrico et al. .......... 250/214 PR |

FOREIGN PATENT DOCUMENTS

| DE | 36 32 084 A1 | 4/1988 |
| DE | 103 14 315 A1 | 10/2004 |

* cited by examiner

*Primary Examiner*—Georgia Epps
*Assistant Examiner*—Don Williams
(74) *Attorney, Agent, or Firm*—Geissler, Olds & Lowe, PLLC

(57) ABSTRACT

A rotary switch including a control element, a light-emitting device arranged on a printed circuit board and configured to emit light, and at least two receivers arranged on the printed circuit board in correspondence with the light-emitting device and configured to detect switching positions of the rotary switch. Further, the light-emitting device is mounted radially at an outside portion of inside of a hollow cylindrical extension of the control element, and wherein on level with the light-emitting device, the extension includes orifices evenly distributed around a periphery of the extension, and that opposite the light-emitting device, on an exterior side of the extension, the at least two receivers are arranged.

22 Claims, 2 Drawing Sheets

INTEGRATED OPTICAL ENCODER

This nonprovisional application is a continuation application of PCT/EP2004/009983, which was filed on Sep. 8, 2004, and which claims priority to German Patent Application No. DE 10342326.5, which was filed in Germany on Sep. 11, 2003, and which are both herein incorporated by reference in their entirety.

BACKGROUND OF THE INVENTION

1. Field of the Invention

The present invention relates to a rotary switch for a control unit in which a light-emitting device and a receiver are arranged on a printed circuit board such that switching positions of the rotary switch can be detected optoelectronically.

2. Description of the Background Art

Optical encoders are used to eliminate mechanical tolerances and influences on rotary switches operated according to a principle of signal tapping via contact springs. The optical encoders register a rotational angle and a direction of a rotational movement of bodies in motion. In addition, the optical encoders generally include a light-emitting device, a grid plate such as a grid disk or grid ruler, and a detection device such as a receiver. The grid plate is connected to the body in motion and includes a periodic aperture pattern. Further, light emitted by the light-emitting device is modulated by the grid plate and the detection device detects the modulated light. The detection device then outputs a digital bit pattern based on the detected bit pattern.

A known optical encoder is disclosed in German publication OS 36 32 084. This optical encoder includes an array of periodic optically effective structures, which interact with a radiation source emitting non-parallel radiation, and a radiation receiver rigidly connected with the radiation source. The receiver has at least two receiving elements, which are positioned vertically or nearly vertically to the direction of the motion of the array with the periodic structures. Therefore, to obtain directional data, at least two receiver elements are required to detect the modulation, whereby a phase shift of the received signals is used to measure the direction of the motion.

In addition, a rotary switch having optoelectric capabilities for detecting the motion and direction of the rotary knob is described in the unpublished German Patent Application DE 103 14 315. In this switch, a light source illuminates the rotary knob and the illuminated light is used as part of an encoder for detecting the motion and direction of a rotary actuator or control element of the switch. In more detail, a part of the light emitted by the light source is forwarded to receivers via a light guide or distributor. Thus, the receivers are mounted level with the light source on a same printed circuit board. Then, a digital bit pattern such as a Gray code is generated based on the received light. The generated digital bit pattern is also further processed in subsequent electronics. In this example, the light source, the light distributor, and the receivers form the optical encoder of the rotary switch.

SUMMARY OF THE INVENTION

It is therefore an object of the present invention to provide an optoelectronic switching system for a rotary switch that can be cost-effectively produced at a minimal constructional expenditure, while at the same time allowing a tolerance compensation for an actuating element of the rotary switch.

To achieve this and other objects, the present invention provides in one aspect a light-emitting device mounted in a radially outward direction inside a hollow cylindrical extension of a control element. Further, on level with the light-emitting device, the extension includes evenly distributed orifices around a periphery thereof. Also include are at least two receivers arranged opposite to the light-emitting device on an external side of the extension. Thus, in accordance with one aspect of the present invention, and optical encoder can be cost-effectively produced while also allowing a tolerance compensation between a control element of the rotary switch and the optoelectronic device used to detect switching positions of the rotary switch.

Further, in accordance with one aspect of the present invention, the light-emitting device and the receivers are mounted directly on the printed circuit board of the rotary switch much like the other elements during production of the switch. Thus, no additional step is required to install the optical encoder.

In addition, the printed circuit board is typically arranged in parallel with the control element of the rotary switch. Also, the light-emitting device functioning as a transmitter is mounted laterally to the printed circuit board so that light is emitted in parallel to the printed circuit board. The receivers are also mounted upright on the printed circuit board across from the light-emitting device, and the hollow cylindrical extension is arranged between the transmitter and the receiver, whereby the extension also serves as a coding ring. The present invention also advantageously decouples the optoelectronic components and control element of the rotary switch.

In addition, in accordance with one aspect of the present invention, the control element can have substantially any chosen tolerance as long as the evenly distributed peripheral orifices in the extension are arranged in an effective range between the transmitter and receiver. Thus, even if the control element is upended or is moved vertically in the direction of the printed circuit board, erroneous coding of the signals is not generated by the transmitter and the receivers.

In yet another aspect of the present invention, a shadow mask is arranged between the extension and the receivers to thereby focus light emitted from the light-emitting element to the receivers. For example, the shadow mask can be molded as a one-piece unit to the housing of the rotary switch, or can be mounted directly in front of the receiver on the printed circuit board. Thus, the shadow mask bundles and orients the light emitted by the light-emitting device to prevent an erroneous signal caused by scattered light.

In addition, in accordance with another aspect of the present invention, the transmitter and receivers are mounted on the printed circuit board at a right angle, that is, in an upright position. However, depending on the type of control element or rotary switch used, the optoelectronic components may be mounted on the printed circuit board with a different orientation if, for example, a more cost-effective production is achieved, or the geometry of the switching operation requires the change.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
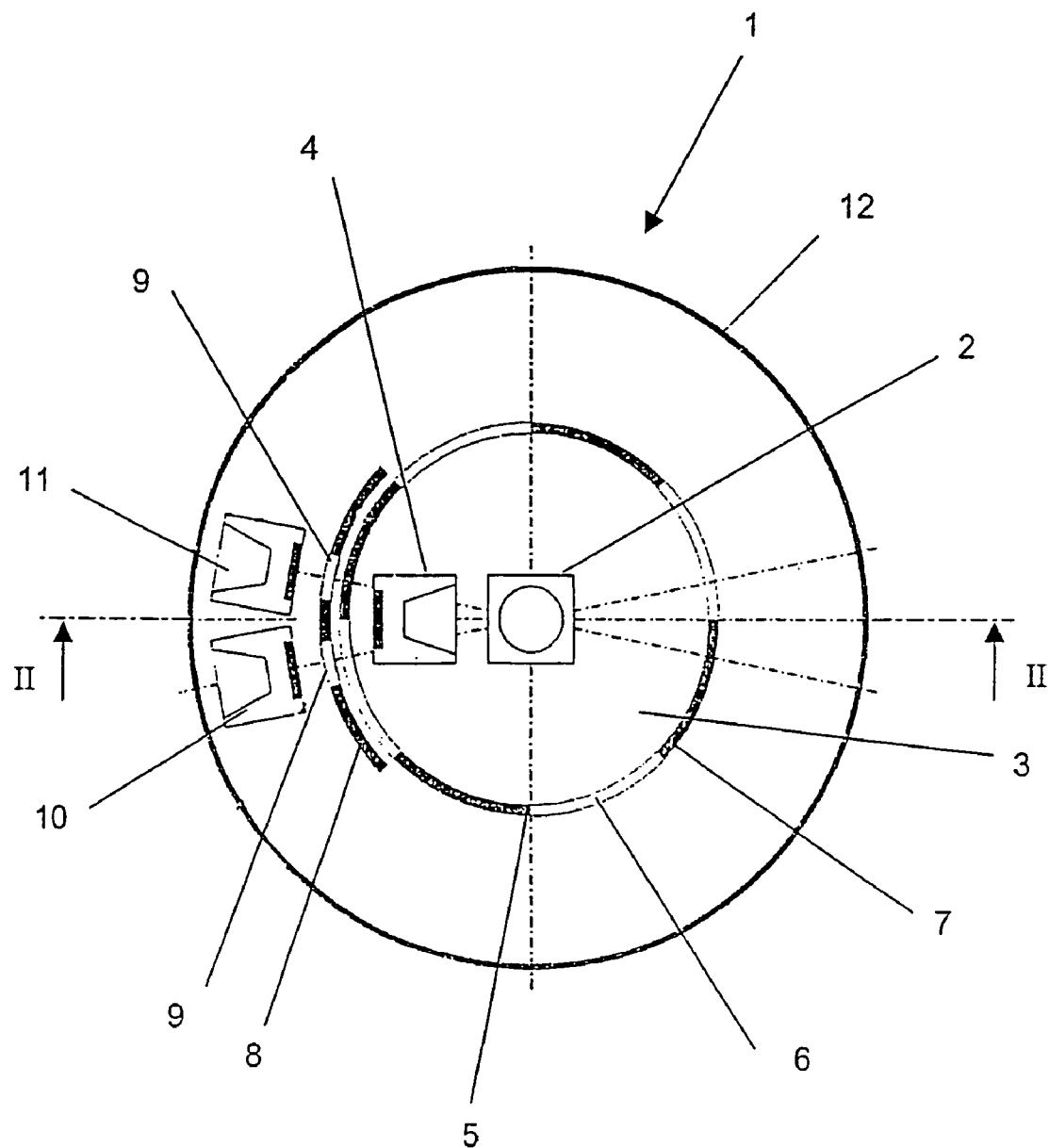
FIG. 1 is a sectional top view illustrating a rotary switch in accordance with an embodiment of the present invention.

FIG. 1 illustrates a rotary switch 1 in accordance with an embodiment of the present invention. As shown, the rotary switch 1 includes a light-emitting diode (LED) 2 arranged in a middle portion of the switch 1, and a light-emitting device 4 mounted on the printed circuit board 3. The LED 2 illuminates a control element 13 (shown in FIG. 2) of the rotary switch 1, and the light-emitting device 4 preferably emits light in the infrared range.

Further, as shown, a hollow cylindrical extension 5 surrounds the LED 2 and the light-emitting diode 4. The extension 5 is rotated via a control knob and thus light from the light-emitting device 4 falls on one or both receivers 10 and 11 depending on the position of the extension 5. In more detail, the extension 5 includes orifices 6 and closed zones 7. A shadow mask 8 is also arranged outside the extension 5 and includes two holes 9, which focus the light from the light-emitting device 4 in the direction of the receivers 10, 11. A housing 12 is also provided to enclose the optoelectronic circuitry (e.g., the LED 2, light-emitting device 4, and receivers 10, 11).

Thus, with reference to FIG. 1, the light-emitting device 4 emits light in the direction of the extension 5, which passes through the orifice 6, but is blocked by the closed zones 7. Therefore, when the extension 5 is in the position shown in FIG. 1, light falls onto the receiver 10 via the orifice 6 and the hole 9, but is blocked from reaching the receiver 11. In this instance, an electronic unit (not illustrated) arranged behind the receiver 10 detects the position of the control element that rotates the extension 5.

In more detail, the receiver 10 receives light and generates a signal, but the receiver 11 does not receive light and thus does not generate a signal. Therefore, the electronic circuit generates a bit pattern of 1,0. Further, if the extension 5 is turned clockwise by a 15 degree angle via the control element of the rotary switch 1, both receivers 10, 11 receive a light beam from the opening 6 and the holes 9. Thus, in this instance, both receivers 10, 11 generate a signal, which is converted to a bit pattern 1,1 by the electronic unit.

In contrast, if the control element of the rotary switch 1 is rotated counter-clockwise by an angle of 15 degrees, neither of the receivers 10,11 receive light from the light-emitting device 4, and thus the electronic circuit generates a bit pattern of 0,0. Further, the generated digital bit patterns can be a Gray code, for example, to thereby positively identify the rotational direction of the control element. Therefore, in accordance with an embodiment of the present invention, it is possible to generate codes or digital bit patterns that represent a location of the control element/rotary knob in a simple manner. Further, the digital bit patterns may represent either fixed steps or an impulse generated both in a positive or a negative direction, depending on the intended application of the rotary switch. A clockwise or counter-clockwise rotation of the control element is thus converted into a Gray code, whereby from grid to grid, merely a bit changes in the generated code.

Figure 2:
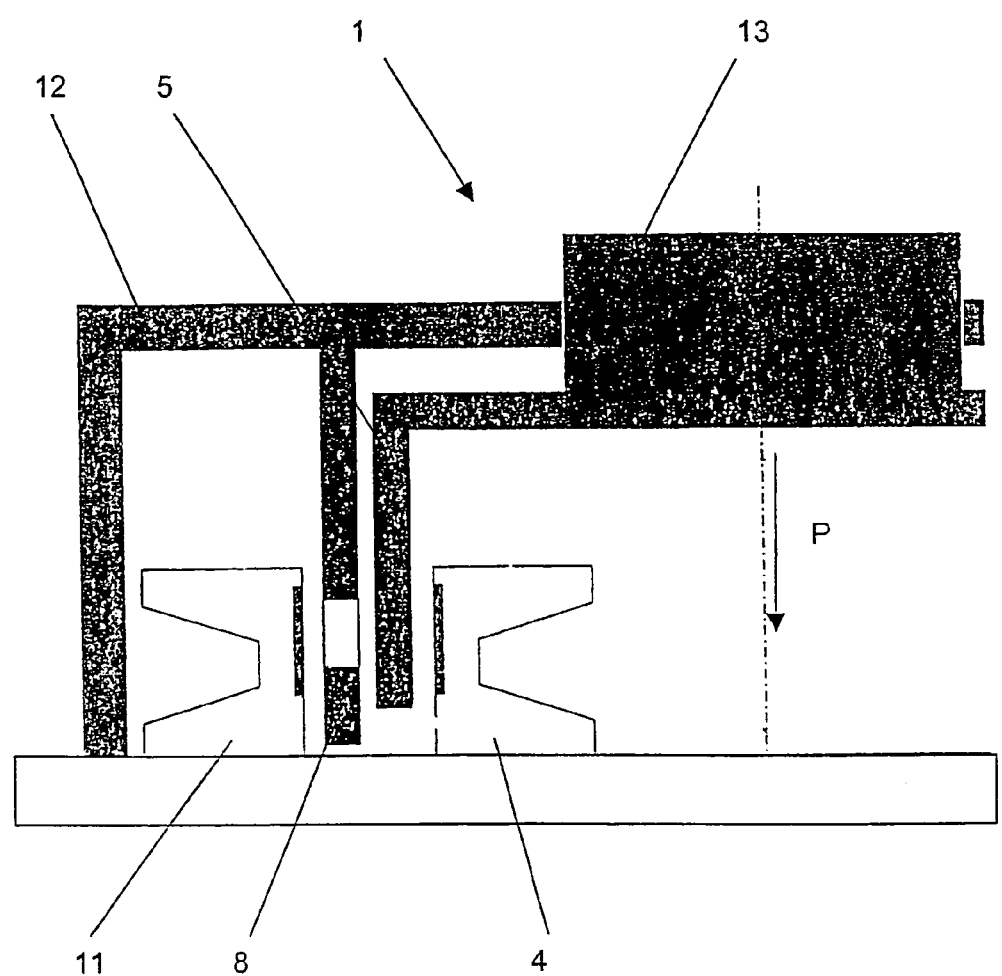
FIG. 2 is a longitudinal cross section view illustrating an arrangement of the optoelectronic components in a rotary switch in accordance with an embodiment of the present invention.

Turning now to FIG. 2, which is a longitudinal cross sectional view along lines II-II in FIG. 1. As shown, the hollow cylindrical extension 5 is molded to the control element 13 as a one-piece unit, and reaches all the way to the area between the light-emitting device 4 and the receivers 10, 11 (receiver 10 is not shown in FIG. 2). In addition, the receivers 10, 11 are infrared light receivers to correspond with the infrared light-emitting device 4, and are preferably infrared phototransistors. Also, as shown, the shadow mask 8 is arranged between the extension 5 and the receivers 10, 11 and is used to focus light from the light-emitting device 4 to the receivers 10, 11.

In addition, the shadow mask 8 is molded to the housing 12 as a one-piece unit, and the holes 9 in the shadow mask 8 are arranged so the receivers 10, 11, are optimally supplied with light in a special V-shaped array. The V-shaped array is thereby relative to the center of the rotary switch 1, whereby the receivers 10, 11, are oriented in a V-shaped manner to the center of the rotary switch 1.

Further, as shown in FIG. 2, the mechanics of the control element 13 are decoupled from the optoelectronic components including the light-emitting device 4 and the receivers 10, 11. Thus, the present invention advantageously allows a tolerance compensation between the optoelectronic components 4, 10, 11 and the control element 13. That is, even if the control element 13 shifts in a vertical direction due to a slidable suspension of the control element 13, the optical components 4, 10, 11 do not shift (because they are decoupled from the control element 13) and thus the position of the rotary switch 1 is still accurately detected. That is, because the orifices 6 of the extension 5 are positioned in the effective range between the light-emitting device 4 and the receivers 10, 11, even an upending of the control element 13 with a simultaneous vertical sliding of the control element 13 does not cause a malfunction in the rotary switch 1.

In addition, is possible to identify grids or positions of the rotary switch 1 based on the digital bit patterns generated by the electronic circuit. For example, as discussed above, if the extension 5 and the orifice 6 are in a position whereby light falls on both receivers 10, 11, the electronic circuit generates the bit pattern signal 1,1 which can be defined as a first grid. If the extension 5 is rotated clockwise by an angle via the control element 13, the receiver 10 no longer receives any light, and the electronic circuit generates the bit pattern 0,1, which may be defined as grid 2. In a subsequent step, whereby the control element is once more rotated by a predetermined value, the closed zone 7 slides in front of the receiver 11, and thus the electronic circuit generates the bit pattern 0,0, which can be defined as a third grid position.

After a further rotation of the control element 13, only the receiver 10 receives light from the light-emitting device 4, and thus the electronic circuit generates the bit pattern 1,0, which can be defined as a fourth grid position. After a further rotation of the control element 13, the bit pattern 1,1 is once again generated in the electronic unit. This fifth grid is identical with grid position 1. In addition, from the grid position 5, the control element 13 can be rotated in a positive direction (i.e., clockwise) or in a negative direction (i.e., counter-clockwise), whereby the electronic circuit provides a positive identification of the rotational direction. In more detail, if the control element is rotated in the positive direction, the bit pattern 0,1 would be generated, and if the control element 13 is rotated in the negative direction, the bit pattern 1,0 would be generated.

Thus, in accordance with embodiments of the present invention, a decoupled rotary switch is provided that is capable of absorbing great tolerances, and that can be cost-efficiently produced. Further, the rotary switch may be used in a control unit of a motor vehicle so as to control an air-condition system, a radio, a navigation device, etc.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A rotary switch, comprising:
   a control element;
   a light-emitting device arranged on a printed circuit board and configured to emit light; and
   at least two receivers arranged on the printed circuit board in correspondence with the light-emitting device and configured to detect switching positions of the rotary switch,
   wherein the light-emitting device is mounted inside of a hollow cylindrical extension of the control element, and
   wherein on level with the light-emitting device, the extension includes orifices evenly distributed around a periphery of the extension, and that opposite the light-emitting device, on an exterior side of the extension, the at least two receivers are arranged,
   wherein the orifices in the extension are spaced to provide the following settings:
      each receiver is individually masked;
      both receivers are simultaneously masked; and
      neither receiver is masked.

2. The rotary switch of claim 1, wherein the at least two receivers are arranged side-by-side in a plane that is at right angles with the printed circuit board.

3. The rotary switch of claim 1, wherein the control element is part of a control unit in a motor vehicle, the light-emitting device is a light-emitting diode (LED), each receiver is a phototransistor, and the LED and the phototransistors are connected to one another via an electric circuit arrangement.

4. The rotary switch of claim 1, wherein the extension includes closed zones disposed between the orifices, and
   wherein the orifices in the extension are spaced to provide at least the following settings:
      two of the at least two receivers are simultaneously masked by a same one of the closed zones; and
      the two of the at least two receivers are simultaneously unmasked by a same one of the orifices.

5. The rotary switch of claim 1, further comprising:
   a stationary shadow mask arranged between the extension and the receivers and configured to focus light emitted by the light-emitting device in the direction of the at least two receivers.

6. A rotary switch, comprising:
   a control element;
   a light-emitting device arranged on a printed circuit board and configured to emit light;
   at least two receivers arranged on the printed circuit board in correspondence with the light-emitting device and configured to detect switching positions of the rotary switch,
      wherein the light-emitting device is mounted inside of a hollow cylindrical extension of the control element,
      wherein on level with the light-emitting device, the extension includes orifices evenly distributed around a periphery of the extension, and that opposite the light-emitting device, on an exterior side of the extension, the at least two receivers are arranged; and
   a stationary shadow mask arranged between the extension and the receivers and configured to focus light emitted by the light-emitting device in the direction of the at least two receivers.

7. A rotary switch, comprising:
   a light-emitting unit configured to emit light;
   a rotatable hollow cylindrical extension surrounding the light-emitting unit;
   at least two receivers arranged outside of the rotatable extension in correspondence with the light-emitting unit and configured to detect light transmitted from the light-emitting unit; and
   a control element configured to rotate the rotatable extension,
   wherein the rotatable extension includes orifices around a periphery of the extension such that as the control element rotates the extension to a particular position, the light emitted by the light-emitting unit either passes through the orifices of the extension or is blocked by the extension,
   wherein the orifices in the extension are spaced to provide the following settings:
      each receiver is individually masked;
      both receivers are simultaneously masked; and
      neither receiver is masked.

8. The rotary switch of claim 7, further comprising:
   an electronic circuit configured to generate bit patterns based on whether or not the light emitted by the light-emitting unit passes through the orifices and is received by any of the at least two receivers.

9. The rotary switch of claim 8, wherein in a first position, the extension is positioned such that the orifices allow the light emitted by the light-emitting unit to pass through and be received by only a first one of the at least two receivers.

10. The rotary switch of claim 9, wherein in a second position, the extension is positioned such that the orifices allow the light emitted by the light-emitting unit to pass through and be received by both of the at least two receivers.

11. The rotary switch of claim 10, wherein in a third position, the extension is positioned such that the orifices allow the light emitted by the light-emitting unit to pass through and be received by only a second one of the at least two receivers.

12. The rotary switch of claim 11, wherein in a fourth position, the extension is positioned such that the orifices are not arranged to allow the light emitted by the light-emitting unit to pass through and be received by any of the at least two receivers.

13. The rotary switch of claim 12, wherein the electronic circuit determines whether the extension has been rotated in a clockwise or counter-clockwise direction based on the first, second, third and fourth positions.

14. The rotary switch of claim 7, wherein the light-emitting unit and the at least two receivers are decoupled from the control element.

15. The rotary switch of claim 7, wherein the light-emitting unit and the at least two receivers are mounted on a printed circuit board.

16. The rotary switch of claim 15, wherein the at least two receivers are arranged side-by-side in a plane that is at right angles with the printed circuit board.

17. The rotary switch of claim 7, further comprising:
   a light-emitting diode arranged in a center of the rotatable extension and configured to illuminate the control element.

18. The rotary switch of claim 7, wherein the control element is associated with a control knob of the rotary switch.

19. The rotary switch of claim 7, wherein the control element is part of a control unit in a motor vehicle, the light-emitting device is a light-emitting diode (LED), each receiver is a phototransistor, and the LED and the phototransistors are connected to one another via an electric circuit arrangement.

20. The rotary switch of claim 7, wherein the extension includes closed zones disposed between the orifices, and
　wherein the orifices in the extension are spaced to provide at least the following settings:
　　two of the at least two receivers are simultaneously masked by a same one of the closed zones; and
　　the two of the at least two receivers are simultaneously unmasked by a same one of the orifices.

21. The rotary switch of claim 7, further comprising:
a stationary shadow mask arranged between the rotatable extension and the at least two receivers and configured to focus light emitted by the light-emitting unit in the direction of the at least two receivers.

22. A rotary switch, comprising:
a light-emitting unit configured to emit light;
a rotatable hollow cylindrical extension surrounding the light-emitting unit;
at least two receivers arranged outside of the rotatable extension in correspondence with the light-emitting unit and configured to detect light transmitted from the light-emitting unit;
a control element configured to rotate the rotatable extension,
　wherein the rotatable extension includes orifices around a periphery of the extension such that as the control element rotates the extension to a particular position, the light emitted by the light-emitting unit either passes through the orifices of the extension or is blocked by the extension; and
a stationary shadow mask arranged between the rotatable extension and the at least two receivers and configured to focus light emitted by the light-emitting unit in the direction of the at least two receivers.

* * * * *